United States Patent
Mertens et al.

(10) Patent No.: US 10,972,096 B2
(45) Date of Patent: Apr. 6, 2021

(54) ELECTRONIC SWITCH

(71) Applicant: NXP USA, INC., Austin, TX (US)

(72) Inventors: Robert Matthew Mertens, Austin, TX (US); James Robert Feddeler, Lake Village, IN (US); Michael A. Stockinger, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/457,117

(22) Filed: Jun. 28, 2019

(65) Prior Publication Data

US 2020/0412363 A1    Dec. 31, 2020

(51) Int. Cl.
*H03K 17/687* (2006.01)

(52) U.S. Cl.
CPC .................. *H03K 17/6872* (2013.01)

(58) Field of Classification Search
CPC .................. H03K 17/6782; H03K 2017/066
See application file for complete search history.

(56) References Cited

U.S. PATENT DOCUMENTS

| | | | |
|---|---|---|---|
| 7,760,007 B2 | 7/2010 | Holzmann | |
| 8,228,109 B2 | 7/2012 | Stockinger et al. | |
| 8,583,111 B2 | 11/2013 | Burgener et al. | |
| 9,667,244 B1 | 5/2017 | Cavus et al. | |
| 10,230,363 B2 * | 3/2019 | Gailhard | H03K 3/012 |
| 10,236,873 B2 * | 3/2019 | Cical | H03K 3/012 |
| 2007/0285149 A1 | 12/2007 | Nakatani et al. | |
| 2019/0051366 A1 | 2/2019 | Elsayed | |

OTHER PUBLICATIONS

Dagan, H., "A Low-Power DCVSL-Like GIDL-Free Voltage Driver for Low-Cost RFID Nonvolatile Memory", IEEE Journal of Solid-State Circuits, vol. 48, No. 6, Jun. 2013.
Ravi, H., "Circuit to reduce Gate Induced Drain Leakage in CMOS output buffers", 22nd International Conference on Very Large Scale Integration (VLSI-SoC), 2014.

* cited by examiner

*Primary Examiner* — Lincoln D Donovan
*Assistant Examiner* — Colleen J O Toole
(74) *Attorney, Agent, or Firm* — David G. Dolezal; Joanna G. Geld (57) ABSTRACT

An electronic switch that includes a signal path with a first terminal side of the signal path including cascoded transistors in the signal path. When the switch is in an off state, the gate of one of the cascoded transistors is biased at an intermediate voltage different from the voltage applied to the gate of the other of the cascoded transistors. In one embodiment, having the gate of one of the cascoded transistors biased at an intermediate voltage in an off state may reduce leakage current into a signal terminal of the switch. The electronic switch includes an injection shunting device (e.g. such as a transistor) connected to a node of the signal path. In one embodiment, the injection shunting device prevents the voltage of the node from reaching a specific voltage level due to leakage current when the switch is in an off state.

19 Claims, 3 Drawing Sheets

ELECTRONIC SWITCH

BACKGROUND OF THE INVENTION

Field of the Invention

This invention relates in general to electronic switches.

Background

Electronic systems utilize electronic switches such as transmission gates for selectively allowing or blocking a signal to pass from one node to another node. In some examples, an electronic switch can be used to selectively provide an analog signal received from an external terminal of an integrated circuit to internal circuitry of the integrated circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Disclosed herein is an electronic switch that includes a signal path with a first terminal side of the signal path including cascoded transistors in the signal path. When the switch is in an off state, the gate of one of the cascoded transistors is biased at an intermediate voltage different from the voltage applied to the gate of the other of the cascoded transistors. In one embodiment, having the gate of one of the cascoded transistors biased at an intermediate voltage in an off state may reduce leakage current into a signal terminal of the switch. The electronic switch includes an injection shunting device connected to a node of the signal path. In one embodiment, the injection shunting device prevents the voltage of the node from reaching a specific voltage level when the switch is in an off state.

Figure 1:
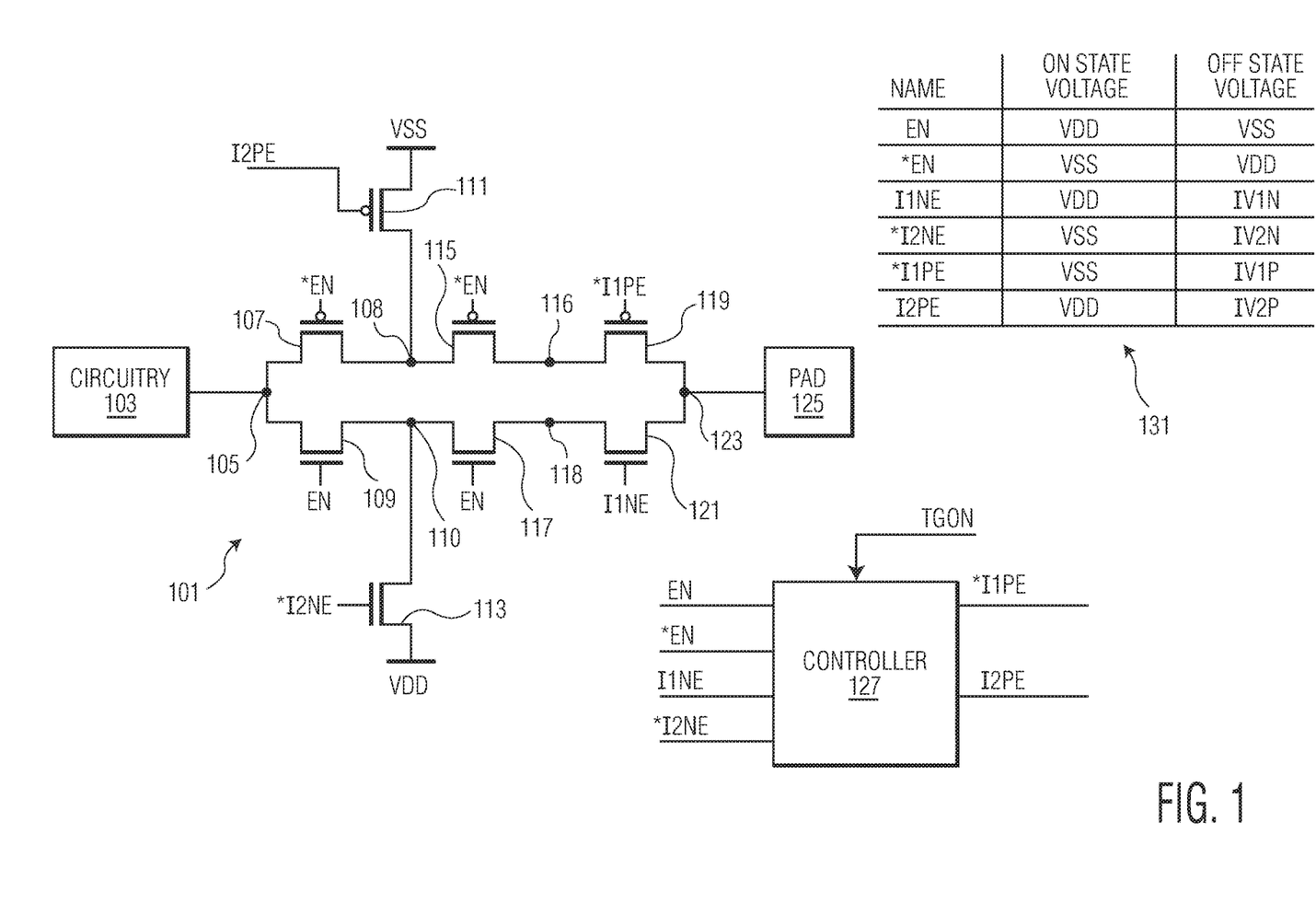
FIG. 1 is a circuit diagram of an electronic switch according to one embodiment of the present invention.

FIG. 1 is a circuit diagram of an electronic switch according to one embodiment of the present invention. In the embodiment shown, electronic switch 101 is used to selectively allow or block a signal (e.g. an analog signal) received at an external terminal (pad 125) of an integrated circuit to be provided to circuitry 103 of the integrated circuit. In one embodiment, circuitry 103 includes circuitry for processing, monitoring, and/or analyzing the information of the analog signal such as analog-to-digital converter circuitry, multiplexer circuitry, processing circuitry, and/or a memory (none shown). Other embodiments may include other types of circuitry. In some embodiments, the switch 101 may be used for selectively allowing or blocking other types of signals and/or be used in other types of circuit configurations.

In the embodiment shown, switch 101 is characterized as a transmission gate that includes an N-channel signal path of N-channel field effect transistors (NFETS) 109, 117, and 121 and a P-channel signal path of P-channel field effect transistors (PFETs) 107, 115, 119. Utilizing a transmission gate with a P-channel signal path and an N-channel signal path as an analog switch may allow the switch to pass an analog signal within the entire range of the supply voltage (VDD to VSS). In one embodiment, the body regions of NFETs 109, 117, and 121 are biased at VSS and the body regions of PFETs 107, 115, and 119 are biased at VDD. However, the body regions may be biased at other voltages in other embodiments. For simplicity of the following description, the VSS potential is assumed to be at 0V. However, in other embodiments the VSS potential may be at a different voltage.

In the embodiment shown, switch 101 includes injection shunting devices 111 and 113 for preventing circuitry 103 from being disturbed by current injected across the switch 101 if the voltage of pad 125 drops below VSS or rises above VDD when switch 101 is in an off state. Device 111 is implemented as a PFET whose gate is biased by signal I2PE. Device 113 is implemented as an NFET whose gate is biased by signal *I2NE. A signal designated with "*" herein indicates that the signal is asserted low. In one embodiment, the body region of the PFET is biased at VDD and the body region of the NFET is biased at VSS, but the body regions may be biased at other voltages in other embodiments.

Controller 127 includes outputs for providing control signals to the transistors of switch 101. Controller 127 provides the EN signal to the gates of NFETS 109 and 117, the *EN signal to the gates of PFETs 107 and 115, the I1NE signal to the gate of NFET 121, the *I1PE signal to the gate of PFET 119, the *I2NE signal to the gate of device 113, and the I2PE signal to the gate of device 111. The voltage levels of these signals reside at one of two voltage level states depending on the switch state of the switch 101. One voltage level state is for when switch 101 is in the on state and both N-channel and P-channel signal paths are conducting to allow a signal to pass between nodes 105 and 123. The other level state is for when switch 101 is in the off state. The level state voltages of each signal are shown in table 131 of FIG. 1. The voltages for the signals when switch 101 is in the on state are given in the column entitled ON STATE VOLTAGE, and the voltages for the signals when switch 101 is in the off state are given in the column entitled OFF STATE VOLTAGE.

Switch 101 is turned on and off by the TGON signal provided to controller 127 from circuitry of the integrated circuit (e.g. registers, fuses, processing circuitry (none shown)). Controller 127 may include power switches, voltage dividers, voltage regulators, voltage reference circuits, charge pumps, or other voltage control or supply circuitry for providing the voltages of the signals during the switch states of the switch 101.

As shown in the second column of table 131, when switch 101 is in the on state such that a signal on pad 125 is to be provided to circuitry 103, the gates of PFETs 107, 115, and 119 are biased at VSS to make those transistors conductive to provide a conductive path from pad 125 to node 105. The gates of NFETs 109, 117, and 121 are biased at VDD to make those transistors conductive to provide a conductive path from pad 125 to node 105. Also, when switch 101 is in the on state, the gate of device 111 is biased at VDD and the gate of device 113 is biased at VSS to make those devices non-conductive to minimize their effect on the signal paths of switch 101.

When switch 101 is off, the voltage of pad 125 and/or the voltage of node 105 may swing from VSS to VDD (e.g. 0 to 3.6 V), in some embodiments. When switch 101 is in the off state, controller 127 provides its output control signals at voltages to bias the transistors of switch 101 to block the signal from pad 125 from reaching node 105. When in the off state, the switch terminals (nodes 105 and 123) are in a high impedance state. In one embodiment, some of the control signals are at intermediate voltages (between VDD and VSS) so as to set the voltages of some of the nodes of the signal paths to reduce the effect of leakage current due to Gate Induced Drain Leakage (GIDL) current of a Field Effect Transistor (FET). GIDL is a leakage current from the drain to the body of a FET that occurs due to a high electric field between the gate and the drain of a FET when the drain to gate voltage is above a GIDL voltage for an NFET or below the GIDL voltage for a PFET. This leakage current may be due to the formation of a deep depletion region at an overlapped gate-drain junction under such conditions. For a PFET, the GIDL voltage is typically negative. For example, if during an off state of switch 101, the voltage on pad 125 were at 3.6 volts and the voltage at the gate of NFET 121 were at 0 volts to turn NFET 121 off, the drain to gate voltage of NFET 121 would be 3.6 volt. If the GIDL voltage of NFET 121 was 2.7 volts, in this example, GIDL leakage current would be generated across NFET 121.

In the embodiment shown, each signal path includes a cascoded pair of transistors on the pad 125 side of the path, where the gate of an outside transistor (PFET 119, NFET 121) of the pair closest to pad 125 is biased at an intermediate voltage instead of VDD or VSS when switch 101 is off. The gate of the outside transistor is biased at an intermediate voltage so as to limit the drain (nodes 116, 118) to gate voltage of the inside transistor (PFET 115, NFET 117) below the GIDL voltage for an NFET or above the GIDL voltage of a PFET when switch 101 is in an off state. The intermediate voltage applied to the gate of the outside transistor limits the GIDL current through the outside transistor as well.

For example, in FIG. 1, when switch 101 is off NFET 121 acts as a source follower such that node 118 is at a voltage of IV1N minus the threshold voltage of NFET 121. The voltage of signal I1NE when switch 101 is off (IV1N) is specified such that node 118 is less than the GIDL voltage (e.g. 2.7 V) of NFET 117, and such that the voltage between pad 125 and I1NE cannot exceed the GIDL voltage of NFET 121. For example, if pad 125 is at VDD (e.g. 3.6V), the gate of NFET 121 is biased at an intermediate voltage of IV1N (e.g. 1.8V), which is between VDD and VSS. When switch 101 is off, the gate of NFET 117 being biased at VSS minimizes channel current through NFET 117, and node 118 being less than the GIDL voltage of NFET 117 minimizes the GIDL leakage current into the drain of NFET 117. Keeping the drain to gate voltage of NFET 121 below its GIDL voltage prevents leakage current at the drain of NFET 121. Thus, in some embodiments, all leakage currents in the N-channel signal path from pad 125 are minimized (gate currents are assumed to be negligible).

As a second example in FIG. 1, when switch 101 is off PFET 119 acts as a source follower such that node 116 is at a voltage of IV1P minus the threshold voltage of PFET 119. The threshold voltage of a PFET is typically negative. The voltage of signal *I1PE when switch 101 is off (IV1P) is specified such that the voltage difference between node 116 and VDD is greater than the GIDL voltage (e.g. −2.7 V) of PFET 115, and such that the voltage between pad 125 and *I1PE cannot fall below the GIDL voltage (e.g. −2.7V) of PFET 119. For example, if pad 125 is at VSS (e.g. 0V), the gate of PFET 119 is biased at an intermediate voltage of IV1P (e.g. 1.8V), which is between VDD and VSS. When switch 101 is off, the gate of PFET 115 being biased at VDD minimizes channel current through PFET 115, and the voltage difference from node 116 to VDD being greater than the GIDL voltage (e.g. −2.7 V) of PFET 115 minimizes the GIDL leakage current at the drain of PFET 115. Keeping the drain to gate voltage of PFET 119 above its GIDL voltage (−2.7 V) prevents leakage current at the drain of PFET 119. Thus, in some embodiments, all leakage currents in the P-channel signal path to pad 125 are minimized (gate currents are assumed to be negligible).

When switch 101 is in the OFF state, injection shunting devices 111 and 113 prevent current from being injected from pad 125 to node 105 when pad 125 is above VDD or below VSS. When switch 101 is off, devices 111 and 113 act as source followers where node 110 is prevented from dropping below VSS and node 108 is prevented from going above VDD. Device 113 provides a low impedance path for current in the N channel signal path that may occur when switch 101 is off and pad 125 goes below VSS. Device 111 provides a low impedance path for current in the P channel signal path that may occur when switch 101 is off and pad 125 goes above VDD. In both cases, this prevents current from flowing from pad 125 to circuitry 103 when switch 101 is in the off state.

In the embodiment shown, when switch 101 is off, supply leakage current is minimized through switch 101 by preventing nodes 108 and 110 from reaching VSS and VDD, respectively. As per table 131, when switch 101 is off, signal I2PE is at voltage IV2P and signal *I2NE is at voltage IV2N, each of which is less than VDD and greater than VSS. With the gate of device 113 being biased at IV2N which is below VDD, the voltage at node 110 is kept at a voltage that is lower than if the gate of device 113 were biased at VDD. The IV2N voltage is set so that the voltage of node 110 is kept below the GIDL voltage of NFETs 109 and 117. When node 105 is at VSS, device 113 prevents the voltage at node 110 from rising above voltage IV2N minus a threshold voltage drop of device 113. With the gate of device 111 being biased at IV2P which is above VSS, the voltage at node 108 is kept above a voltage that is higher than if the gate of device 111 were biased at VSS. The IV2P voltage is set so that VDD subtracted from the voltage of node 108 is kept above the GIDL voltage of PFETs 107 and 115. When node 105 is at VDD, device 111 prevents the voltage at node 108 from dropping below voltage IV2P minus a threshold voltage drop of device 111.

Accordingly, when switch 101 is in an off state, device 113 prevents the voltage of node 110 from falling below VSS or rising as high as if the gate of device 113 were biased at VDD. Also, when switch 101 is off, device 111 prevents node 108 from rising above VDD or sinking as low as if the gate of device 111 were biased at VSS.

In one embodiment, voltages IV1N, IV2N, IV1P, and IV2P are four different intermediate voltages between VDD and VSS. In another embodiment, IV2N and IV1P are the same voltage and IV1N and IV2P are the same voltage. In still another embodiment, IV1N, IV2N, IV1P, and IV2P are the same voltage (e.g. half of the VDD voltage). In still another embodiment, IV1N, IV2N, IV1P, and IV2P are within 10% of each other. In one embodiment, voltages IV1N, IV2N, IV1P, and IV2P are in the range of 10% or greater of VSS and 90% or less than VDD. In one embodiment, VDD is 3.6 volts, VSS is 0 volts, IV2N and IV1P are 2 volts, and IV1N and IV2P are 1.6 volts. However, these voltages may be of other values in other embodiments.

Figure 2:
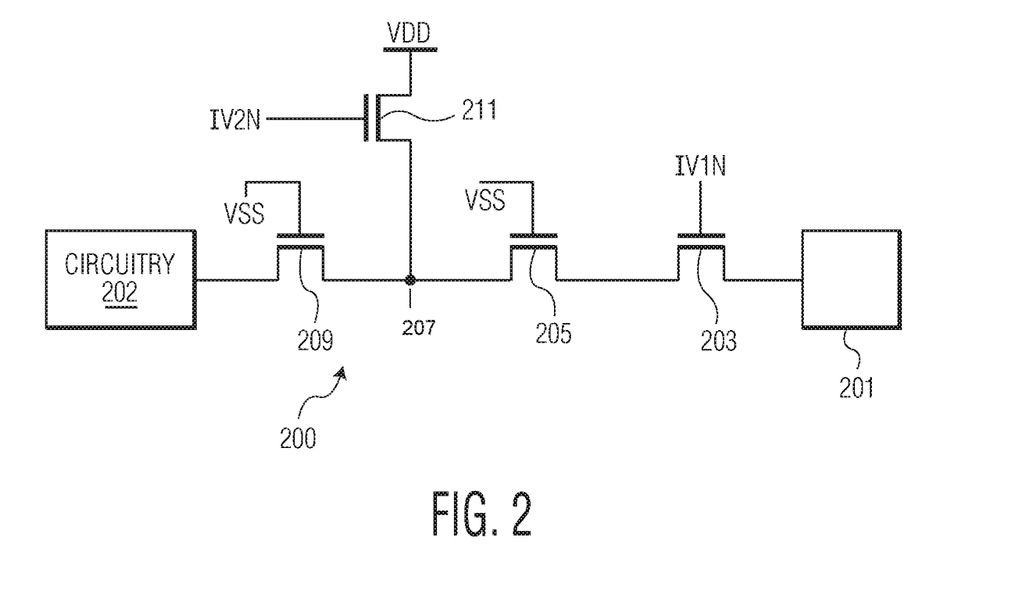
FIG. 2 is a circuit diagram of an electronic switch according to another embodiment of the present invention.

FIG. 2 is a circuit diagram of an electronic switch 200 according to another embodiment of the present invention. Switch 200 is similar to switch 101 of FIG. 1 in that it includes an N-channel signal path of NFETs 209, 205, and 203 between circuitry 202 and pad 201 of an integrated circuit but does not include a P-channel path (e.g. PFETs 107, 115, and 119 of FIG. 1) as with switch 101. Switch 200 is closed or in an on state when a signal from pad 201 is to be provided to circuitry 202 and open or off when it is desired for pad 201 to be isolated from circuitry 202. Switch 200 includes an injection shunting device 211, which in the embodiment shown is implemented with an NFET connected between a VDD supply terminal and node 207. Not shown in FIG. 2 is a controller, which would be similar to controller 127, for providing the control signals to the gates of NFETs 209, 205, and 203 and device 211. FIG. 2 illustrates the voltage levels applied to the gates of the devices when switch 200 is in the off state.

Figure 3:
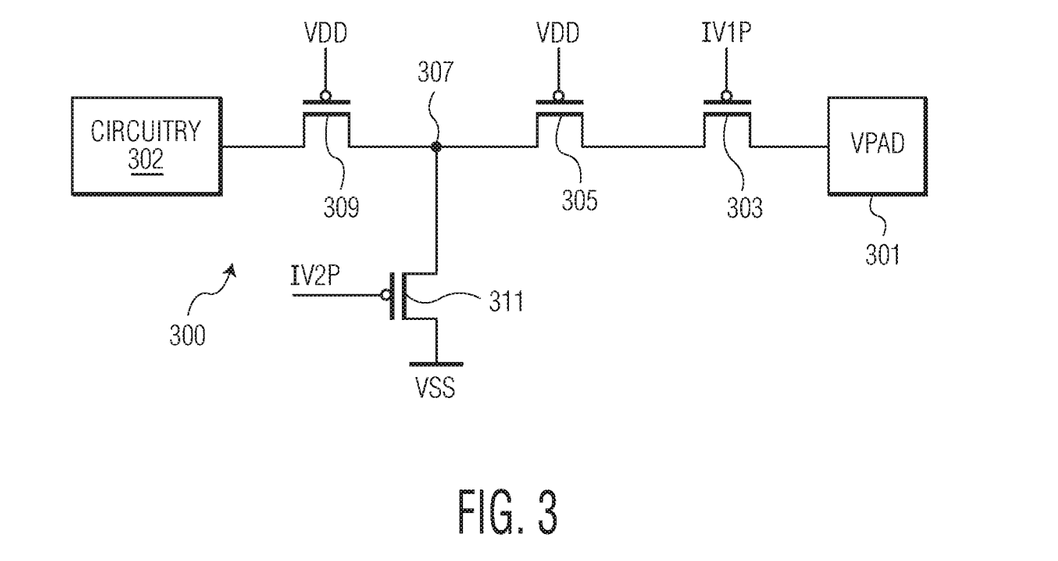
FIG. 3 is a circuit diagram of an electronic switch according to another embodiment of the present invention.

FIG. 3 is a circuit diagram of an electronic switch 300 according to another embodiment of the present invention. Switch 300 is similar to switch 101 of FIG. 1 in that it includes a P-channel signal path of PFETs 309, 305, and 303 between circuitry 302 and pad 301 of an integrated circuit but does not include an N-channel path (e.g. NFETs 109, 117, and 121 of FIG. 1) as with switch 101. Switch 300 is closed or in an on state when an analog signal from pad 301 is to be provided to circuitry 302 and open or off when pad 301 is to be isolated from circuitry 302. Switch 300 includes an injection shunting device 311, which in the embodiment shown is implemented with a PFET connected between a VSS supply terminal and node 307. Not shown in FIG. 3 is a controller, which would be similar to controller 127, for providing the control signals to the gates of PFETs 309, 305, and 303 and device 311. FIG. 3 illustrates the voltage levels applied to the gates of the devices when switch 300 is in the off state.

Figure 4:
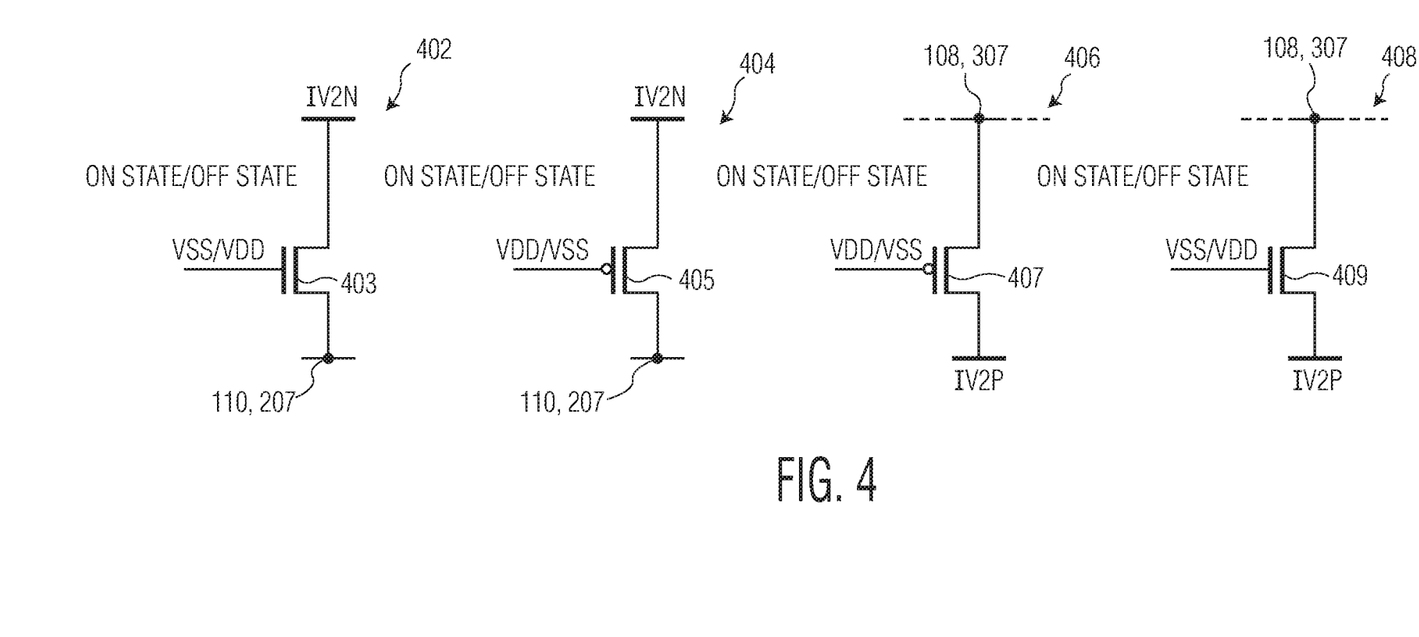
FIG. 4 shows examples of injection shunting devices according to different embodiments of the present invention.

FIG. 4 shows examples of four different injection shunting devices that can be used in place of the injection shunting devices of FIGS. 1-3. Shunting devices 402 and 404 can each be used in place of shunting device 113 of FIG. 1 and shunting device 211 of FIG. 2. Shunting devices 406 and 408 can be used in place of shunting device 111 of FIG. 1 and shunting device 311 of FIG. 3.

Shunting device 402 includes an NFET 403 that includes current electrodes coupled between a voltage reference source that provides an intermediate reference voltage IV2N and a node (e.g. node 110, 207) of an N-channel path of an electronic switch (101, 200). When the switch (101, 200) is in an on state, the gate of NFET 403 is biased at VSS to make NFET 403 non-conductive. When the switch (101, 200) is in an off state, the gate of NFET 403 is biased at VDD to make NFET 403 conductive to bias the node (110, 207) of the N-channel path at the intermediate voltage of IV2N.

Shunting device 404 includes a PFET 405 that includes current electrodes coupled between a voltage reference source that provides an intermediate reference voltage IV2N and a node (e.g. node 110, 207) of an N-channel path of an electronic switch (101, 200). When the switch (101, 200) is in an on state, the gate of PFET 405 is biased at VDD to make PFET 405 non-conductive. When the switch (101, 200) is in an off state, the gate of PFET 405 is biased at VSS to make PFET 405 conductive to bias the node (110, 207) of the N-channel path at the intermediate voltage of IV2N.

Shunting device 406 includes a PFET 407 that includes current electrodes coupled between a voltage reference source that provides an intermediate reference voltage IV2P and a node (e.g. node 110, 307) of a P-channel path of an electronic switch (101, 300). When the switch (101, 300) is in an on state, the gate of PFET 407 is biased at VDD to make PFET 407 non-conductive. When the switch (101, 300) is in an off state, the gate of PFET 407 is biased at VSS to make PFET 407 conductive to bias the node (110, 307) of the P-channel path at the intermediate voltage of IV2P.

Shunting device 408 includes an NFET 409 that includes current electrodes coupled between a voltage reference source that provides an intermediate reference voltage IV2P and a node (e.g. node 110, 307) of a P-channel path of an electronic switch (101, 300). When the switch (101, 300) is in an on state, the gate of NFET 409 is biased at VSS to make NFET 409 non-conductive. When the switch (101, 300) is in an off state, the gate of NFET 409 is biased at VDD to make NFET 409 conductive to bias the node (110, 307) of the P-channel path at the intermediate voltage of IV2P. Other injections shunting devices in other embodiments may have other configurations.

In other embodiments, an electronic switch may include other circuitry, have other configurations, and/or operate in other ways. For example, in some embodiments, the circuitry side of a path of an electronic switch (e.g. at node 105 of FIG. 1) may include an additional transistor cascoded with the transistor (NFET 109, PFET 107) connected to node 105, where the additional transistor would be biased at an intermediate voltage to prevent GIDL leakage current though the transistors (NFET 109, PFET 107). For example, the N-channel path of switch 101 would include an NFET (not shown) similar to NFET 121 coupled between node 105 and NFET 109, where the gate of the additional NFET would be controlled by the I1NE signal. Also, the P-channel path of switch 101 would include a PFET (not shown) similar to PFET 119 coupled between node 105 and PFET 107, where the gate of the additional PFET would be controlled by the *I1PE signal.

In some embodiments, providing a signal path of an electronic switch with a first transistor whose control electrode (a gate of a FET) is biased at an intermediate voltage when the switch is off and with a second transistor whose control electrode is biased at a different voltage to make the transistor non-conductive, may provide for a switch that reduces or minimizes GIDL leakage current in the signal path. Also, providing an injection shunting device for limiting the voltage of a node in the path may also reduce current leakage in the electronic switch.

In one embodiment, an electronic switch is connected between a first signal node and a second signal node. The electronic switch includes a first transistor of a first conductivity type having a first current electrode coupled to the first signal node and a second current electrode coupled to a first intermediate node. The electronic switch including a second transistor of the first conductivity type having a first current electrode coupled to the first intermediate node and a second current electrode coupled to a second intermediate node. The electronic switch including a third transistor of the first conductivity type having a first current electrode coupled to the second intermediate node and a second current electrode coupled to the second signal node. When the electronic switch is in an on state, the first, second, and third transistors of the first conductivity type form a first signal path to communicate signals between the first and second signal nodes. The electronic switch including an injection shunting device coupled to the first intermediate node and a controller coupled to the injection shunting device and a control electrode of each of the first, second, and third transistors. When the electronic switch is in an off state such that signals are not communicated between the first signal node and the second signal node through the first signal path, the controller is configured to set the control electrode of each of the first and second transistors to a second voltage which turns off the first and second transistors. The second voltage is different than a first voltage. The controller is configured to set the control electrode of the third transistor to a first intermediate voltage. The injection shunting device includes an electrode that is biased at a second intermediate voltage and is configured to prevent a voltage at the first intermediate node from going above the second voltage if the first conductivity type is P-type or from going below the second voltage if the first conductivity type is N-type. Each of the first and second intermediate voltages is between the first and second voltages. When the electronic switch is in an on state, the injection shunting device is in a nonconductive state. When the electronic switch is in the on state, the controller is configured to put the first, second, and third transistors in a conductive state wherein the first voltage is applied to the control electrodes of the first, second, and third transistors.

In another embodiment, an electronic switch is connected between a first signal node and a second signal node. The electronic switch includes a first transistor of a first conductivity type having a first current electrode coupled to the first signal node and a second current electrode coupled to a first intermediate node. The electronic switch includes a second transistor of the first conductivity type having a first current electrode coupled to the first intermediate node and a second current electrode coupled to a second intermediate node. The electronic switch includes a third transistor of the first conductivity type having a first current electrode coupled to the second intermediate node and a second current electrode coupled to the second signal node. When the electronic switch is in an on state, the first, second, and third transistors of the first conductivity type form a first signal path to communicate signals between the first and second signal nodes. The electronic switch includes a fourth transistor having a first current electrode coupled to the first intermediate node, and having a second electrode. The electronic switch includes a controller coupled to a control electrode of each of the first, second, third, and fourth transistors. When the electronic switch is in an off state such that signals are not communicated between the first and second signal nodes through the first signal path, the controller is configured to set the control electrodes of each of the first and second transistors to a second voltage which turns off the first and second transistors, the second voltage is different from a first voltage, and set the control electrode of the third transistor to a first intermediate voltage. The second electrode of the fourth transistor is at a second intermediate voltage. Each of the first and second intermediate voltages is between a first voltage and a second voltage. When the electronic switch is in the on state, the controller is configured to put the first, second, and third transistors in a conductive state, wherein the first voltage is applied to the control electrodes of the first, second, and third transistors.

In another embodiment, an electronic switch is connected between a first signal node and a second signal node. The electronic switch includes a first P-type transistor having a first current electrode coupled to the first signal node and a second current electrode coupled to a first intermediate node. The electronic switch includes a second P-type transistor having a first current electrode coupled to the first intermediate node and a second current electrode coupled to a second intermediate node. The electronic switch includes a third P-type transistor having a first current electrode coupled to the second intermediate node and a second current electrode coupled to the second signal node. When the electronic switch is in an on state, the first, second, and third P-type transistors form a first signal path to communicate signals between the first and second signal nodes. The electronic switch includes a fourth P-type transistor having a first current electrode coupled to the first intermediate node and having a second electrode. The electronic switch includes a first N-type transistor having a first current electrode coupled to the first signal node and a second current electrode coupled to a third intermediate node. The electronic switch includes a second N-type transistor having a first current electrode coupled to the third intermediate node and a second current electrode coupled to a fourth intermediate node. The electronic switch includes a third N-type transistor having a first current electrode coupled to the fourth intermediate node and a second current electrode coupled to the second signal node. When the electronic switch is in the on state, the first, second, and third N-type transistors form a second signal path to communicate signals between the first and second signal nodes. The electronic switch includes a fourth N-type transistor having a first current electrode coupled to the third intermediate node and having a second electrode. The electronic switch includes a controller coupled to a control electrode of each of the first, second, third, and fourth P-type transistors, and to a control electrode of each of the first, second, third, and fourth N-type transistors. When the electronic switch is in an off state such that signals are not communicated between the first and second signal node through the first signal path or through the second signal path. The controller is configured to set the control electrode of each of the first and second P-type transistors to a second voltage, which turns off the first and second P-type transistors, set the control electrodes of each of the first and second N-type transistors to a first voltage which turns off the first and second N-type transistors, set the control electrode of the third P-type transistor to a first intermediate voltage, and set the control electrode of the third N-type transistor to a third intermediate voltage. The second electrode of the fourth P-type transistor is at a second intermediate voltage and the second electrode of the fourth N-type transistor is at a fourth intermediate voltage. Each of the first, second, third, and fourth intermediate voltages is between the first and second voltages, the second voltage is greater than the first voltage.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An electronic switch connected between a first signal node and a second signal node, the electronic switch comprising:
   a first transistor of a first conductivity type having a first current electrode coupled to the first signal node and a second current electrode coupled to a first intermediate node;

a second transistor of the first conductivity type having a first current electrode coupled to the first intermediate node and a second current electrode coupled to a second intermediate node;

a third transistor of the first conductivity type having a first current electrode coupled to the second intermediate node and a second current electrode coupled to the second signal node, wherein when the electronic switch is in an on state, the first, second, and third transistors of the first conductivity type form a first signal path to communicate signals between the first and second signal nodes;

an injection shunting device coupled to the first intermediate node; and a controller coupled to the injection shunting device and a control electrode of each of the first, second, and third transistors, wherein when the electronic switch is in an off state such that signals are not communicated between the first signal node and the second signal node through the first signal path, the controller is configured to set the control electrode of each of the first and second transistors to a second voltage which turns off the first and second transistors, wherein the second voltage is different than a first voltage, and set the control electrode of the third transistor to a first intermediate voltage; and the injection shunting device includes an electrode that is biased at a second intermediate voltage and is configured to prevent a voltage at the first intermediate node from going above the second voltage if the first conductivity type is P-type or from going below the second voltage if the first conductivity type is N-type;

wherein each of the first and second intermediate voltages is between the first and second voltages, wherein when the electronic switch is in an on state, the injection shunting device is in a nonconductive state; and wherein when the electronic switch is in the on state, the controller is configured to put the first, second, and third transistors in a conductive state wherein the first voltage is applied to the control electrodes of the first, second, and third transistors.

2. The electronic switch of claim 1, wherein each of the first and second intermediate voltages is at a value that is at least the lower of the first and second voltages plus 10% of a difference between the first and second voltages and at most the higher of the first and second voltages minus 10% of the difference between the first and second voltages.

3. The electronic switch of claim 1, wherein the first conductivity type is N-type, and the first voltage is greater than the second voltage.

4. The electronic switch of claim 1, wherein the first conductivity type is P-type, and the first voltage is less than the second voltage.

5. The electronic switch of claim 1, wherein the injection shunting device comprises a fourth transistor of the first conductivity type having a first current electrode coupled to the first voltage, and a second current electrode coupled to the first intermediate node, wherein:

when the electronic switch is in an off state, the controller is configured to set a control electrode of the fourth transistor to the second intermediate voltage.

6. The electronic switch of claim 5, wherein the first conductivity type is N-type.

7. The electronic switch of claim 1, wherein the injection shunting device comprises a fourth transistor of the first conductivity type having a first current electrode coupled to the first intermediate node, wherein:

when the electronic switch is in an off state, the controller is configured to set a control electrode of the fourth transistor to a voltage to make the fourth transistor conductive, where a second current electrode of the fourth transistor is at the second intermediate voltage.

8. The electronic switch of claim 1, wherein the injection shunting device comprises a fourth transistor of a second conductivity type opposite the first conductivity type having a first current electrode coupled to the first intermediate node, wherein:

when the electronic switch is in an off state, the controller is configured to set a control electrode of the fourth transistor to a voltage to make the fourth transistor conductive, where a second current electrode of the fourth transistor is at the second intermediate voltage.

9. The electronic switch of claim 1, further comprising:

a first transistor of a second conductivity type, opposite the first conductivity type, having a first current electrode coupled to the first signal node and a second current electrode coupled to a third intermediate node;

a second transistor of the second conductivity type having a first current electrode coupled to the third intermediate node and a second current electrode coupled to a fourth intermediate node;

a third transistor of the second conductivity type having a first current electrode coupled to the fourth intermediate node and a second current electrode coupled to the second signal node, wherein when the electronic switch is in the on state, the first, second, and third transistors of the second conductivity type form a second signal path to communicate signals between the first and second signal nodes;

a second injection shunting device coupled to the third intermediate node, wherein the controller is further coupled to the second injection shunting device and a control electrode of each of the first, second, and third transistors, wherein when the electronic switch is in the off state such that signals are not communicated between the first and second signal node through the second signal path, the controller is configured to set the control electrode of each of the first and second transistors of the second conductivity type to the first voltage, which turns off the first and second transistors of the second conductivity type, and set the control electrode of the third transistor of the second conductivity type to a third intermediate voltage.

10. An electronic switch connected between a first signal node and a second signal node, the electronic switch comprising:

a first transistor of a first conductivity type having a first current electrode coupled to the first signal node and a second current electrode coupled to a first intermediate node;

a second transistor of the first conductivity type having a first current electrode coupled to the first intermediate node and a second current electrode coupled to a second intermediate node;

a third transistor of the first conductivity type having a first current electrode coupled to the second intermediate node and a second current electrode coupled to the second signal node, wherein when the electronic switch is in an on state, the first, second, and third transistors of the first conductivity type form a first signal path to communicate signals between the first and second signal nodes;
a fourth transistor having a first current electrode coupled to the first intermediate node, and having a second electrode; and
a controller coupled to a control electrode of each of the first, second, third, and fourth transistors,
wherein when the electronic switch is in an off state such that signals are not communicated between the first and second signal nodes through the first signal path,
the controller is configured to set the control electrodes of each of the first and second transistors to a second voltage which turns off the first and second transistors, the second voltage is different from a first voltage, and set the control electrodes of the third transistor to a first intermediate voltage,
the second electrode of the fourth transistor is at a second intermediate voltage, and
wherein each of the first and second intermediate voltages is between a first voltage and a second voltage, and
wherein when the electronic switch is in the on state, the controller is configured to put the first, second, and third transistors in a conductive state, wherein the first voltage is applied to the control electrodes of the first, second, and third transistors.

11. The electronic switch of claim 10, wherein each of the first and second intermediate voltages is at a value that is at least the lower of the first and second voltages plus 10% of a difference between the first and second voltages and at most the higher of the first and second voltages minus 10% of the difference between the first and second voltages.

12. The electronic switch of claim 10, wherein the first and second intermediate voltages are within 10% of each other.

13. The electronic switch of claim 10, wherein when the first conductivity type is N-type, the first voltage is greater than the second voltage, and when the first conductivity type is P-type, the first voltage is less than the second voltage.

14. The electronic switch of claim 10, wherein the first conductivity type is N-type, when the electronic switch is in the off state, the fourth transistor is configured to prevent a voltage at the first intermediate node from going below the second voltage, and to prevent a voltage of the first intermediate node from rising above the second intermediate voltage minus a threshold voltage drop of the fourth transistor when the first signal node is at the second voltage.

15. The electronic switch of claim 10, wherein the first conductivity type is P-type, when the electronic switch is in the off state, the fourth transistor is configured to prevent a voltage at the first intermediate node from going above the second voltage, and to prevent a voltage of the first intermediate node from dropping below the second intermediate voltage minus a threshold voltage drop of the fourth transistor when the first signal node is at the second voltage.

16. The electronic switch of claim 10, further comprising:
a fifth transistor of the first conductivity type coupled between the first signal node and the first transistor, wherein the fifth transistor has a first current electrode coupled to the first signal node and a second current electrode coupled to the first current electrode of the first transistor, wherein when the electronic switch is in an on state, the first, second, third, and fifth transistors of the first conductivity type form the first signal path to communicate signals between the first and second signal nodes.

17. An electronic switch connected between a first signal node and a second signal node, the electronic switch comprising:
a first P-type transistor having a first current electrode coupled to the first signal node and a second current electrode coupled to a first intermediate node;
a second P-type transistor having a first current electrode coupled to the first intermediate node and a second current electrode coupled to a second intermediate node;
a third P-type transistor having a first current electrode coupled to the second intermediate node and a second current electrode coupled to the second signal node, wherein when the electronic switch is in an on state, the first, second, and third P-type transistors form a first signal path to communicate signals between the first and second signal nodes;
a fourth P-type transistor having a first current electrode coupled to the first intermediate node and having a second electrode;
a first N-type transistor having a first current electrode coupled to the first signal node and a second current electrode coupled to a third intermediate node;
a second N-type transistor having a first current electrode coupled to the third intermediate node and a second current electrode coupled to a fourth intermediate node;
a third N-type transistor having a first current electrode coupled to the fourth intermediate node and a second current electrode coupled to the second signal node, wherein when the electronic switch is in the on state, the first, second, and third N-type transistors form a second signal path to communicate signals between the first and second signal nodes;
a fourth N-type transistor having a first current electrode coupled to the third intermediate node and having a second electrode;
a controller coupled to a control electrode of each of the first, second, third, and fourth P-type transistors, and to a control electrode of each of the first, second, third, and fourth N-type transistors,
wherein when the electronic switch is in an off state such that signals are not communicated between the first and second signal node through the first signal path or through the second signal path,
the controller is configured to set the control electrode of each of the first and second P-type transistors to a second voltage, which turns off the first and second P-type transistors, set the control electrodes of each of the first and second N-type transistors to a first voltage which turns off the first and second N-type transistors, set the control electrode of the third P-type transistor to a first intermediate voltage, and set the control electrode of the third N-type transistor to a third intermediate voltage,
the second electrode of the fourth P-type transistor is at a second intermediate voltage and the second electrode of the fourth N-type transistor is at a fourth intermediate voltage,
wherein each of the first, second, third, and fourth intermediate voltages is between the first and second voltages, the second voltage is greater than the first voltage.

18. The electronic switch of claim 17, wherein the first and fourth intermediate voltages have a first same value, and the second and third intermediate voltages have a second same value.

19. The electronic switch of claim 17, wherein when the electronic switch is in the on state, the controller is configured to set the control electrode of the first P-type transistor, the second P-type transistor, and the third P-type transistor to the first voltage and configured to set the control electrode of the first N-type transistor, the second N-type transistor, and the third N-type transistor to the second voltage.

\* \* \* \* \*